United States Patent  (10) Patent No.: US 8,660,821 B2
Andoji et al.  (45) Date of Patent: Feb. 25, 2014

(54) DESIGNING UTILITY NETWORKS FOR A GEOGRAPHIC AREA

(75) Inventors: Kavitha Andoji, Hyderabad (IN); Bhargav J. Oza, Vadodara (IN); Bhaskar Praveen Vepakomma, Hyderabad (IN); Prem Swaroop Sadineedi, Hyderabad (IN)

(73) Assignee: General Electric Company, Schenectady, NY (US)

( * ) Notice: Subject to any disclaimer, the term of this patent is extended or adjusted under 35 U.S.C. 154(b) by 211 days.

(21) Appl. No.: 12/949,322

(22) Filed: Nov. 18, 2010

(65) Prior Publication Data

US 2012/0130683 A1 May 24, 2012

(51) Int. Cl.
*G06F 17/50* (2006.01)
(52) U.S. Cl.
CPC ............... *G06F 17/509* (2013.01)
USPC ............................................. 703/1; 370/254
(58) Field of Classification Search
None
See application file for complete search history.

(56) References Cited

U.S. PATENT DOCUMENTS

| 5,329,464 A * | 7/1994 | Sumic et al. ............. 703/1 |
| 2004/0054508 A1* | 3/2004 | Mc Cabe et al. .......... 703/1 |
| 2006/0020430 A1* | 1/2006 | Gipps et al. ............. 703/1 |
| 2006/0247902 A1* | 11/2006 | Rourke ................... 703/1 |
| 2007/0168923 A1* | 7/2007 | Connor et al. ........... 717/104 |
| 2007/0186094 A1* | 8/2007 | Ghantous et al. ........ 713/153 |
| 2009/0210277 A1* | 8/2009 | Hardin et al. ........... 705/8 |
| 2009/0290508 A1* | 11/2009 | Puthenpura et al. ...... 370/254 |

OTHER PUBLICATIONS

Unknown, Introduction to Autodesk Utilities Design: Integrating the Network Design Process, 2008, 11 pages, Autodesk, Inc.

* cited by examiner

*Primary Examiner* — Kamini Shah
*Assistant Examiner* — Jay B Hann
(74) *Attorney, Agent, or Firm* — Armstrong Teasdale LLP

(57) ABSTRACT

A method for use in designing a utility network to provide a utility to a geographic area. A computer system determines a demand point within the geographic area at which to provide the utility. The computer system also determines a source point to provide the utility to the utility network. A connection path through the geographic area is determined, connecting the source point to the demand point. In addition, a bill of materials may be generated, indicating a set of equipment required to convey the utility from the source point to the demand point along the determined connection path.

20 Claims, 6 Drawing Sheets

DESIGNING UTILITY NETWORKS FOR A GEOGRAPHIC AREA

BACKGROUND OF THE INVENTION

The subject matter disclosed herein relates generally to utility networks and, more specifically, to systems and methods for use in designing a utility network.

At least some known utility networks are used to convey a utility, such as electricity or natural gas, from a source point to a demand point. Further, at least some known software enables a user to specify a utility network design for a geographic area, and some provide an option to start with a preconfigured design. Even with a preconfigured design, such software generally requires the user to manually define a path along which to convey the utility. For example, the user may be required to route the utility around obstructions within a particular geographic area. Moreover, the user may be required to determine and select equipment appropriate for conveying the utility along the manually defined path, which requires considerable knowledge and experience on the part of the user. The level of user involvement may add significant delay, cost, and inaccuracy to the utility network design process.

BRIEF DESCRIPTION OF THE INVENTION

In one aspect, a system for use in designing a utility network is provided. The system includes an input interface configured to receive an indication of a geographic area within which the utility network is to be constructed. The system also includes a processor that is coupled to the input interface and programmed to identify one or more obstructions within the geographic area. The processor is also programmed to determine one or more demand points for the utility network and to determine a source point providing a utility associated with the utility network. The processor is further programmed to determine one or more connection paths within the geographic area to convey the utility from the source point to each demand point of the plurality of demand points based at least in part on the identified obstructions.

In another aspect, a method for use in designing a utility network to provide a utility to a geographic area. The method includes determining, by a computer system, a demand point within the geographic area at which to provide the utility. A source point to provide the utility to the utility network is determined by the computer system. A connection path through the geographic area connecting the source point to the demand point is also determined by the computer system. A bill of materials is generated by the computer system indicating a set of equipment required to convey the utility from the source point to the demand point along the determined connection path.

In yet another aspect, one or more computer-readable storage media having computer-executable instructions embodied thereon are provided. When executed by at least one processor, the computer-executable instructions cause the at least one processor to determine a demand point within a geographic area at which to provide the utility, to determine a source point to provide the utility to the demand point, and to determine a connection path through the geographic area for conveying the utility from the source point to the demand point. The connection path is determined based at least in part on one or more obstructions within the geographic area.

DETAILED DESCRIPTION OF THE INVENTION

The embodiments described herein facilitate automating the design of a utility network, taking into account the presence of physical obstructions and constraints, such as regulatory constraints, environmental constraints, and demand constraints. As used herein, the term "utility" includes, but is not limited to only including, electricity, natural gas, water (e.g., fresh water, sewage, or drainage), television service, and/or wired or wireless telecommunication service.

A utility network is operable to convey a utility from one or more source localities, source lines, or source points, to one or more demand localities, demand lines, or demand points. For example, a source locality may include a utility generation facility or an existing utility network. A source line may include an existing utility transmission line or utility distribution line. A source point may include a utility distribution point (e.g., a substation and/or a transformer), a specific point within a utility network, and/or a specific point along a utility transmission line.

The means of conveying a utility may be dependent on the nature of the utility. For example, natural gas and potable water are generally conveyed at high pressure via a piping network. Electricity may be conveyed via electrically conductive cables. Telecommunication service may be conveyed by electrically conductive cables, optical cables, and/or wireless transmission.

Embodiments are described herein with reference to utility networks for electricity. However, such embodiments facilitate designing utility networks for any type of utility.

An exemplary technical effect of the methods, systems, and apparatus described herein includes at least one of (a) determining a demand point within the geographic area at which to provide the utility; (b) determining a source point to provide the utility to the utility network; (c) determining a connection path through the geographic area connecting the source point to the demand point; and (d) generating a bill of materials indicating a set of equipment required to convey the utility from the source point to the demand point along the determined connection path.

Figure 1:
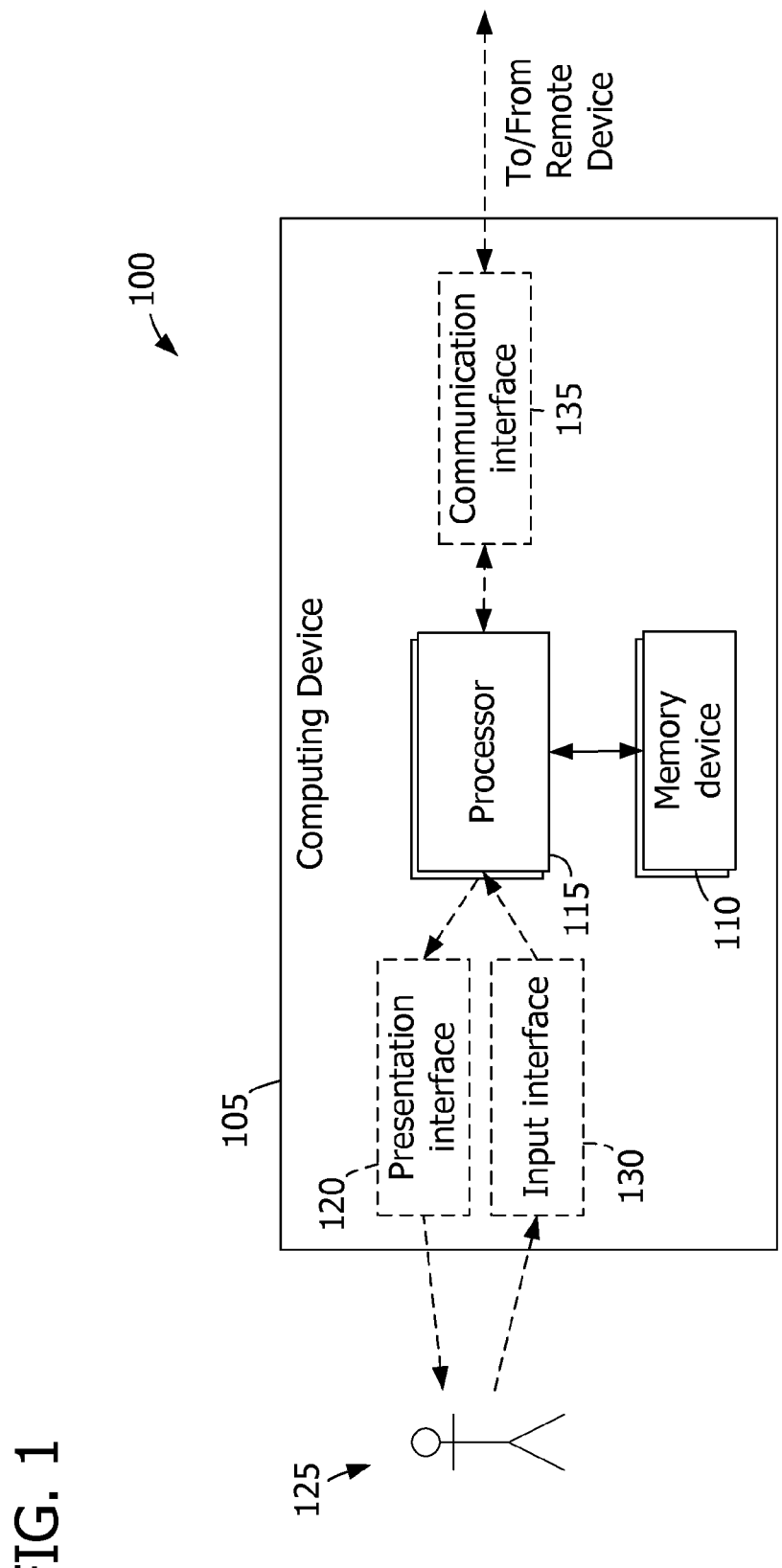
FIG. 1 is a block diagram of an exemplary computing device.

FIG. 1 is a block diagram of an exemplary design system 100 with a computing device 105 that includes a memory device 110 and that may be used to design a utility network. Computing device 105 includes a processor 115 coupled to memory device 110 for executing programmed instructions. In some embodiments, executable instructions are stored in memory device 110. Computing device 105 is programmable to perform one or more operations described herein by programming processor 115. For example, processor 115 may be programmed by encoding an operation as one or more executable instructions and providing the executable instructions in memory device 110. Processor 115 may include one or more processing units (e.g., in a multi-core configuration).

Processor 115 may include, but is not limited to, a general purpose central processing unit (CPU), a graphics processing unit (GPU), a microcontroller, a reduced instruction set computer (RISC) processor, an application specific integrated circuit (ASIC), a programmable logic circuit (PLC), and/or any other circuit or processor capable of executing the functions described herein. The methods described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term processor.

Memory device 110 is one or more devices allowing information such as executable instructions and/or other data to be stored and retrieved. Memory device 110 may include one or more computer readable media, such as, without limitation, dynamic random access memory (DRAM), static random access memory (SRAM), a solid state disk, and/or a hard disk. Memory device 110 may be configured to store, without limitation, executable instructions, configuration data, geographic data (e.g., topography data and/or obstructions), utility network equipment data, and/or any other type of data.

In the exemplary embodiment, computing device 105 includes a presentation interface 120 coupled to processor 115. Presentation interface 120 is configured to output (e.g., display, print, and/or otherwise output) information, such as, but not limited to, a map of a geographic area including obstructions and existing utility equipment, to a user 125. For example, presentation interface 120 may include a display adapter (not shown in FIG. 1) that is coupled to a display device, such as a cathode ray tube (CRT), a liquid crystal display (LCD), an organic LED (OLED) display, and/or an "electronic ink" display. In some embodiments, presentation interface 120 includes more than one display device. In addition to, or in the alternative, presentation interface 120 may include a printer.

In some embodiments, computing device 105 includes an input interface 130 that receives input from user 125. For example, input interface 130 may be configured to receive a selection of a utility type, a selection of a geographic area, a selection of a connection path, and/or any other information suitable for use with the methods and systems described herein. As described below, computing device 105 transforms one or more received inputs into a design of a utility network.

In the exemplary embodiment, input interface 130 is coupled to processor 115 and may include, for example, a keyboard, a pointing device, a mouse, a stylus, a touch sensitive panel (e.g., a touch pad or a touch screen), a gyroscope, an accelerometer, a position detector, and/or an audio input interface. A single component, such as a touch screen, may function as both a display device of presentation interface 120 and as input interface 130.

Computing device 105 may include a communication interface 135 coupled to processor 115. Communication interface 135 is coupled in communication with a remote device, such as another computing device 105. For example, communication interface 135 may include, without limitation, a wired network adapter, a wireless network adapter, and/or a mobile telecommunications adapter.

In an exemplary embodiment, computing device 105 stores in memory device 110 and/or is operable to access via communication interface 135 (e.g., from another computing device 105) data for use in designing a utility network. For example, such data may include, but is not limited to only including, market data (e.g., costs and/or billing details associated with utility equipment), load forecasting data (e.g., projected demand data for one or more geographic areas), demographic data (e.g., past, current, and/or projected population data for one or more geographic areas), and/or business rules (e.g., a minimum margin between projected demand and available capacity).

Figure 2:
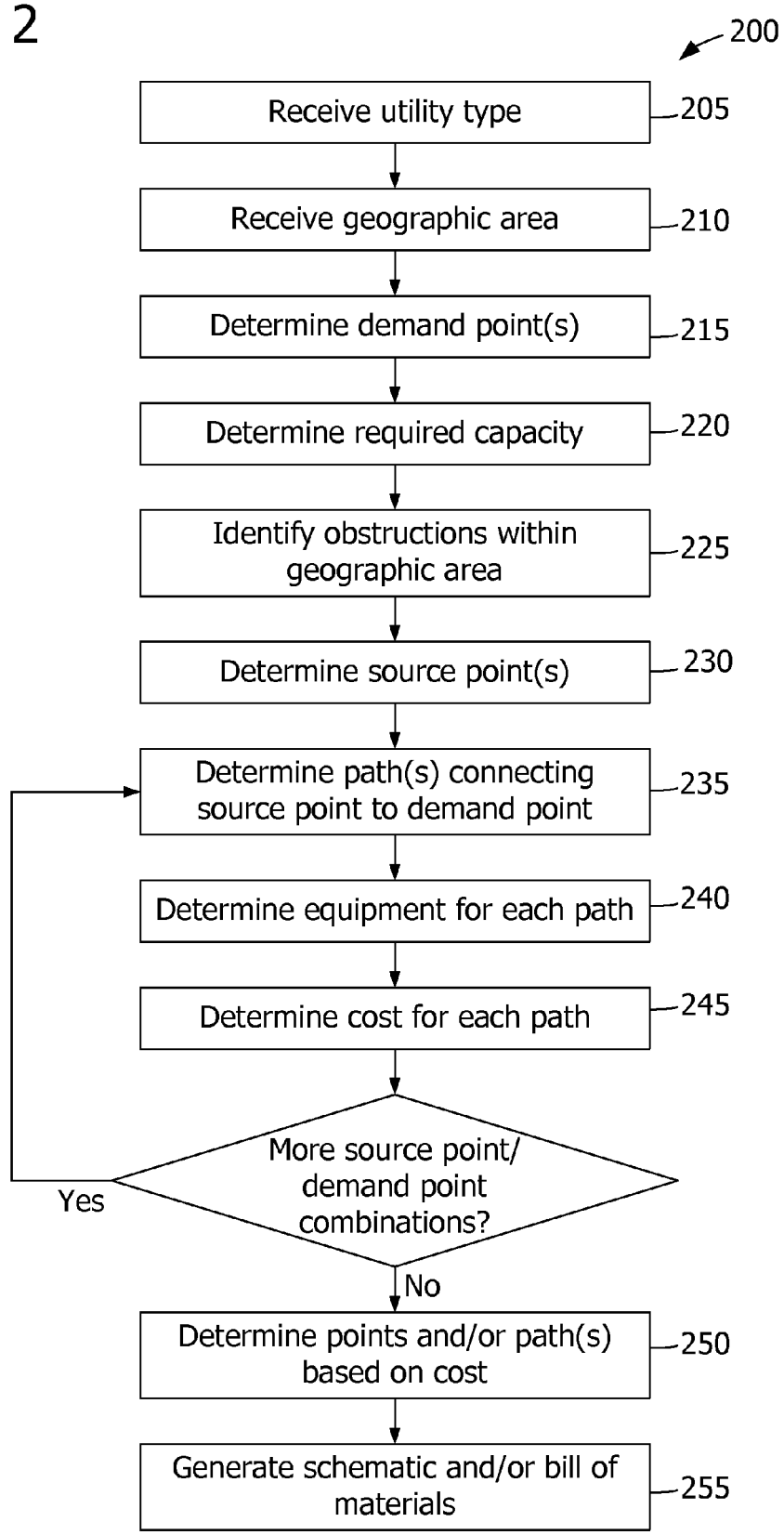
FIG. 2 is a flowchart of an exemplary method for use in designing a utility network.
Figure 3:
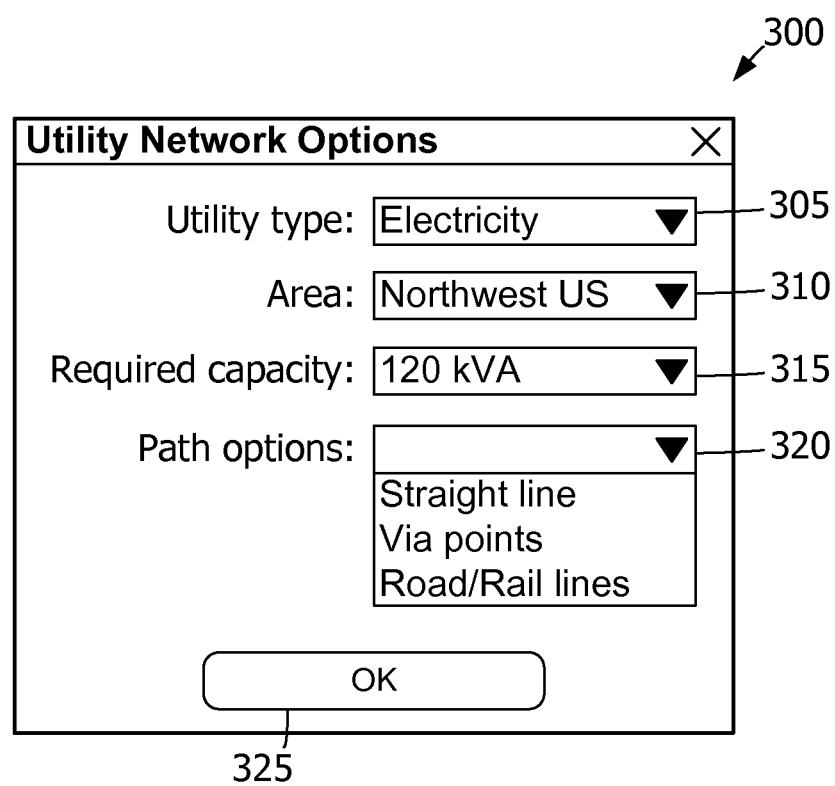
FIG. 3 is an exemplary graphical interface that may be used with the method shown in FIG. 2.
Figure 4:
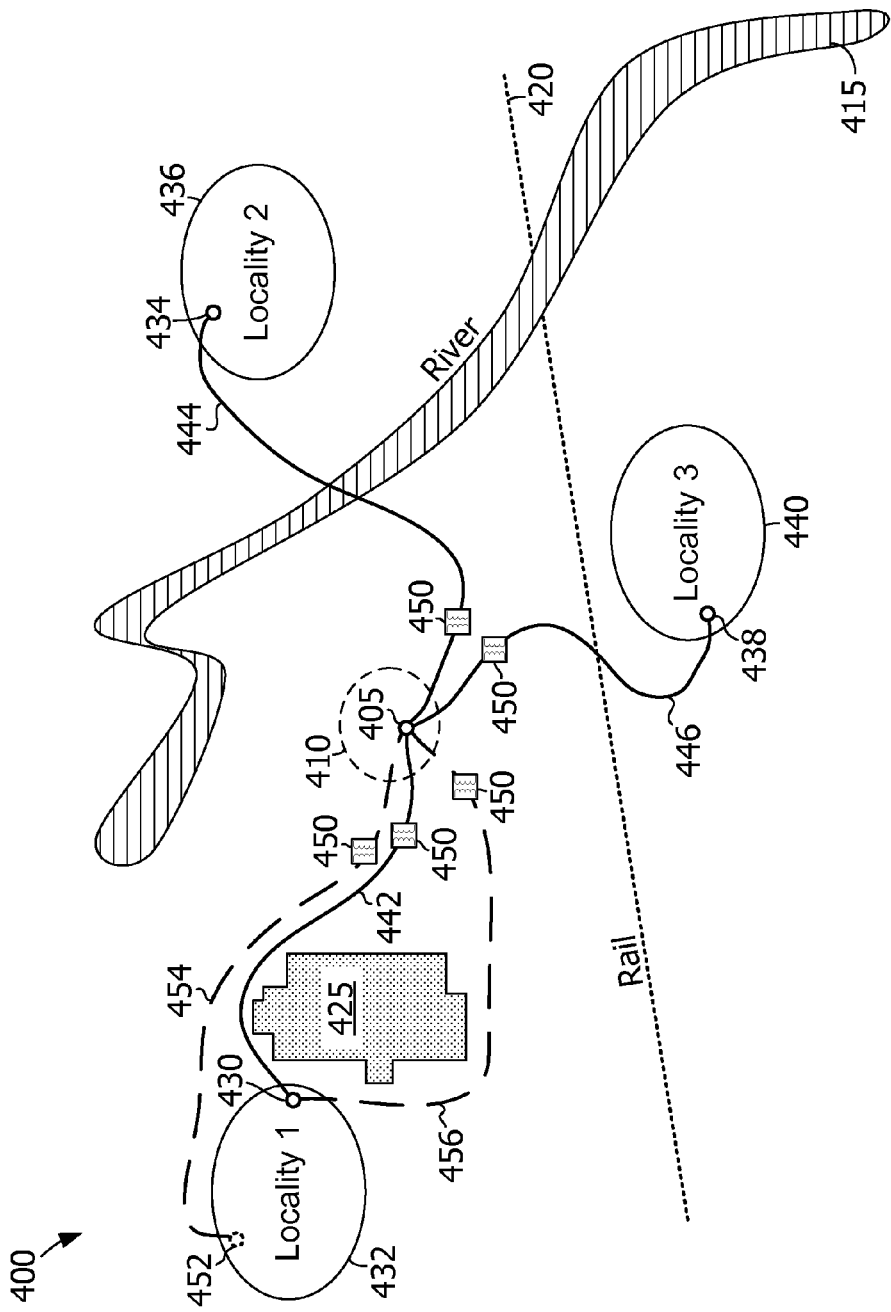
FIG. 4. is an exemplary map that may be displayed when the method shown in FIG. 2 is executed.
Figure 5:
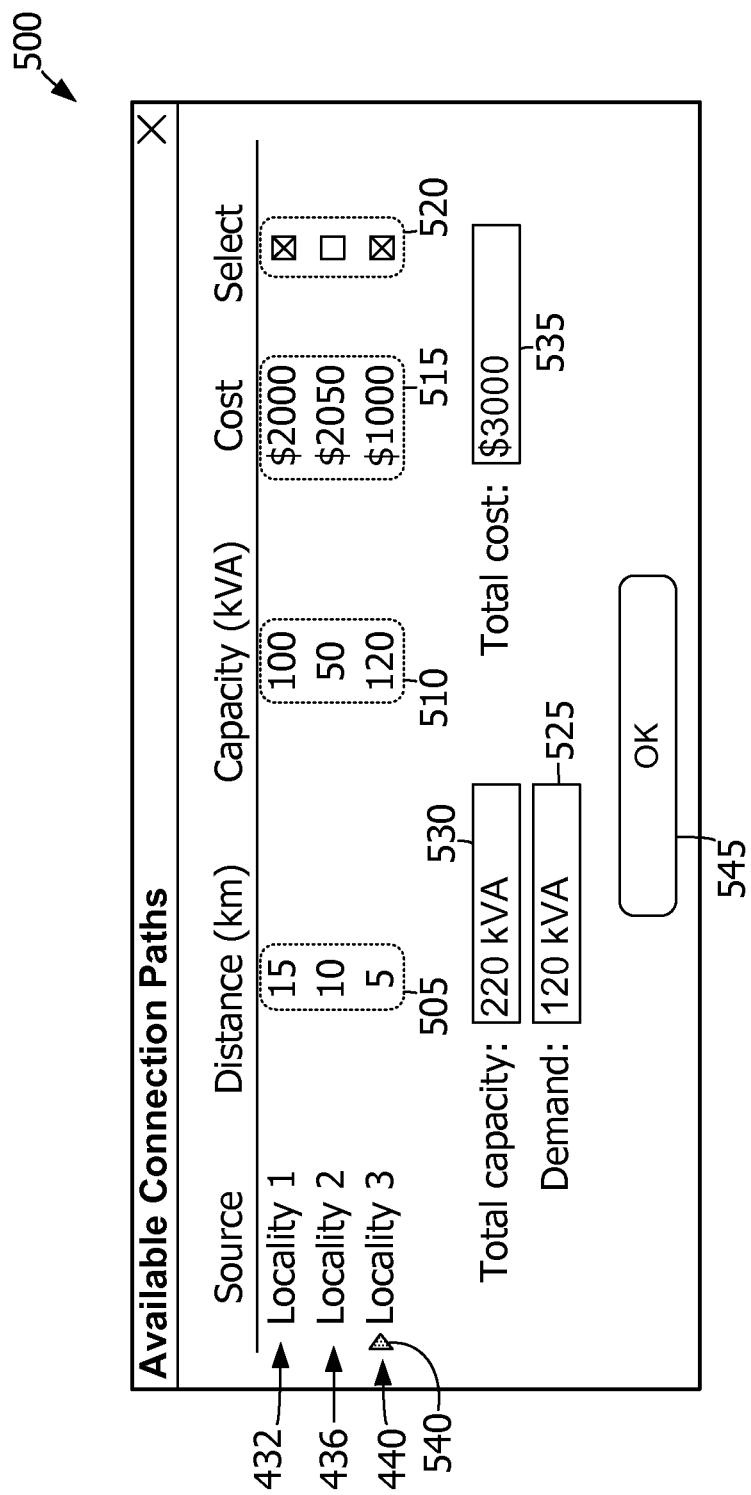
FIG. 5 is an exemplary graphical interface for use in selecting connection paths between source points and demand points in accordance with the method shown in FIG. 2.

FIG. 2 is a flowchart of an exemplary method 200 for use in designing a utility network. Portions of method 200 may be performed by any one of or any combination of computing devices 105 (shown in FIG. 1). FIG. 3 is an exemplary graphical interface 300 that may be used to select options related to a utility network in accordance with method 200. FIG. 4 is an exemplary map 400 that may be displayed when method 200 is executed. FIG. 5 is an exemplary graphical interface 500 for use in selecting connection paths between source points and demand points in accordance with method 200.

In the exemplary embodiment, graphical interface 300, map 400, and graphical interface 500 are presented by a computing device 105 (e.g., via presentation interface 120, shown in FIG. 1) and may receive input (e.g., selections) via input interface 130 (shown in FIG. 1). In another embodiment, one or more of the selections described below are received via communication interface 135 (shown in FIG. 1). For example, a selection may be received via an input interface 130 of a remote computing device 105 and may be transmitted by a communication interface 135 of the remote computing device 105.

In an exemplary embodiment, a selection of a utility type is received 205. For example, graphical interface 300 may include a utility type selector 305 for use in selecting the utility to be conveyed by the utility network being designed. Utility type selector 305 includes a list of known utility types, such as, but not limited to, electricity, natural gas, television service, telecommunications service, water, drainage, and/or sewage.

A selection of a geographic area is received 210 by computing device 105. For example, the selection of the geographic area may be received 210 via a geographic area selector 310 of graphical interface 300. In an exemplary embodiment, geographic area selector 310 includes a list of geographic areas (e.g., continents, countries, regions, states, provinces, and/or localities). In another embodiment, geographic area selector 310 is a map (not shown) in which a geographic area may be selected (e.g., by selecting a portion of the map). In yet another embodiment, geographic area selector 310 is a text field in which a user may enter a location (e.g., a city name or a postal code).

Referring to FIG. 4, a map 400 that includes the selected geographic area may be presented by computing device 105. In an exemplary embodiment, map 400 depicts entities associated with geographical positions and/or boundaries from a plurality of sources. For example, geographical features, such as bodies of water and/or topography, may be provided by a geographic information system (GIS). Existing and/or planned utility equipment may be provided by a GIS, a public or private utility database, an enterprise resource planning (ERP) system, and/or any other source of utility information.

One or more demand points 405 within the geographic area of map 400 are determined 215 by computing device 105. In some embodiments, computing device 105 determines 215 a demand point by receiving a selection of demand point 405 within map 400 from a user. In another embodiment, computing device 105 receives a selection of a demand locality 410 within map 400. Demand locality 410 includes one or more properties (e.g., residential, commercial, and/or industrial properties; not shown) that require the utility. Computing device 105 selects demand point 405 from a plurality of available demand points within demand locality 410 based at least in part on a cost of connecting the selected point to the properties and/or to one or more source points (as described below).

A required capacity for one or more demand points 405 is determined 220 by computing device 105. In an exemplary embodiment, graphical interface 300 includes a required capacity selector 315, which includes a list of capacities, for use in determining 220 (e.g., receiving a selection of) a required capacity. Graphical interface 300 populates required capacity selector 315 with capacities corresponding to the utility type selected via utility type selector 305. In the exemplary embodiment, with a selected utility type of "Electricity", required capacity selector 315 includes capacities expressed in kilovolt-amperes (kVA), a measure of apparent power. As another example, for a selected utility type of "Water", required capacity selector 315 may include capacities expressed as a measure of flow rate (e.g., gallons per minute).

In some embodiments, computing device 105 determines 220 a required capacity based on a demand forecast. For example, required capacity selector 315 may include a "Forecast-based" option (not shown). When the "Forecast-based" option is selected, computing device 105 determines 220 a required capacity for one or more demand points based at least in part on a current "baseline" demand for the utility and a forecast of future demand for the utility. The baseline demand may be retrieved from an enterprise resource planning (ERP) system and/or from utility usage data stored in memory device 110 (shown in FIG. 1). The forecast represents predicted demand over a predetermined duration (e.g., five years or ten years). For example, computing device 105 may request demand forecast information from an ERP system and/or retrieve demand forecast information from memory device 110. In an exemplary embodiment, the demand forecast is based on projected demographic data (e.g., population data, population distribution data, age data, and/or income data) associated with demand point 405 and/or with demand locality 410 in which demand point 405 lies. For example, when the projected demographic data indicates growth in utility usage over the predetermined duration, computing device 105 determines 220 a required capacity that is greater than the baseline demand.

In one embodiment, required capacity selector 315 includes multiple forecasting options. For example, required capacity selector 315 may include "Forecast-based (5 years)" and "Forecast-based (10 years)" options that correspond to predetermined durations, such as five years and ten years, respectively.

Graphical interface 300 may also include a path option selector 320. In an exemplary embodiment, path option selector 320 includes a list of options for use in defining one or more connection paths to connect source points to demand points. For example, a "Straight line" option indicates that connection paths should be defined as straight as is feasible and/or possible. Such an option may facilitate reducing the amount of transmission line required. A "Via points" option indicates that the user should be prompted to select one or more points through which connection paths should be defined. For example, the user may define a point through an existing or planned village to ensure the utility will be available within the village. Alternatively, the user may define one or more points outside a village to ensure connection paths are defined to circumvent the village, such that the disruption to the village and/or the cost of building the utility network is reduced. A "Road/Rail lines" option indicates that connection paths should be defined along roads and/or rail lines. Such an option may facilitate reducing the cost of building the utility network by taking advantage of existing utility easements. The values selected in utility type selector 305, required capacity selector 315, and path option selector 320 may be referred to as design constraints.

Computing device 105 identifies 225 obstructions within the selected geographic area. In an exemplary embodiment, computing device 105 accesses a geographic information system (GIS) that provides geographic data, such as topography data and/or obstruction data. Obstructions may include, but are not limited to only including, natural structures (e.g., bodies of water, streams, and/or hills or mountains), man-made structures (e.g., buildings, roadways, rail lines, and/or existing utility equipment, such as a transmission line for an unrelated utility), and/or restricted areas (e.g., environmental protection areas or areas zoned for limited development). Referring again to FIG. 4, map 400 includes obstructions in the form of a river 415, a rail line 420, and a restricted development zone 425.

Computing device 105 determines 230 one or more source points (e.g., within the geographic area) that are capable of providing the utility. In one embodiment, computing device 105 determines 230 a source point by receiving a selection of the source point within map 400. In an exemplary embodiment, computing device 105 determines 230 source points by identifying a plurality of source points that are proximate to a first demand point of the one or more determined demand points and that individually or collectively have a capacity to provide the utility at a rate required by demand point 405.

Some embodiments facilitate determining 230 a source point based on a cost associated with each source point. Referring to FIG. 4, in an exemplary embodiment, computing device 105 determines a first source point 430 within a first source locality 432, a second source point 434 within a second source locality 436, and a third source point 438 within a third source locality 440. Source points 430, 434, and 438 are proximate to demand locality 410 and are associated with existing and/or previously planned utility networks in the corresponding source localities 432, 436, and 440. For example, source points 430, 434, and 438 may represent locations from which a utility network may be extended to demand point 405.

Computing device 105 determines 235 one or more connection paths connecting each source point to the demand point. In the exemplary embodiment, computing device 105 determines 235 a first connection path 442 connecting first source point 430 to demand point 405, a second connection path 444 connecting second source point 434 to demand point 405, and a third connection path 446 connecting third source point 438 to demand point 405. Connection paths may be determined 235 based at least in part on the presence of one or more obstructions. For example, first connection path 442 is determined 235 such that first connection path 442 circumvents restricted development zone 425.

For each connection path, computing device 105 determines 240 a set of equipment required to convey the utility from the source point to the demand points along the determined connection paths. For example, computing device 105 may determine one or more utility requirements associated with demand point 405, such as a required voltage, a required pressure, a required flow rate, and/or a required line characteristic (e.g., inside diameter and/or outside diameter). Computing device 105 may further identify one or more corresponding utility characteristics associated with a source point and/or a transmission line and determine that one or more pieces of equipment is required to satisfy the utility requirements associated with demand point 405. In one embodiment, computing device 105 stores a plurality of demand point types (e.g., residential, commercial, and/or industrial) associated with utility requirements, and a user indicates the utility requirements for demand point 405 at least in part by selecting a demand point type (e.g., residential and/or commercial). In addition to, or in the alternative, the user may manually specify one or more utility requirements for demand point 405.

In the exemplary embodiment, demand point 405 is associated with a required voltage of 240 volts (V), and each source point 430, 434, and 438 is associated with a supply voltage of 230 kilovolts (kV). Computing device 105 determines 240 that a specific length and/or type of transmission line (e.g., electrical cable), a step-down transformer 450, and a specific length and/or type of distribution line are required for each connection path 442, 444, and 446. Computing device 105 may also determine 240 equipment required to suspend or bury a transmission line and/or distribution line to avoid an obstruction, such as river 415 or rail line 420.

Computing device 105 determines 245 a cost of connecting each source point 430, 434, and 438 to the demand point 405. For example, computing device 105 may combine the cost of equipment required for each connection path 442, 444, and 446 to create a total cost for the connection path. Computing device 105 may determine 245 the cost for each source point 430, 434, and 438 based further on labor costs, installation costs, inspection costs, and/or regulatory costs associated with the equipment and/or the connection path. For example, the total cost may include an estimated cost of burying a portion of a transmission line under rail line 420 or suspending a portion of a transmission line over river 415.

In some embodiments, computing device 105 determines 230 multiple source points within a source locality. For example, computing device 105 may determine 230 a fourth source point 452 within first source locality 432 and determine 235 a fourth connection path 454 connecting fourth source point 452 to demand point 405. In addition to, or in the alternative, computing device 105 may determine 235 multiple connection paths for a source point. For example, computing device 105 may determine 235 that first source point 430 may be connected to demand point 405 via first connection path 442 or a fifth connection path 456. Computing device 105 determines 240 equipment required for fourth connection path 454 and fifth connection path 456 and determines 245 a corresponding cost, as described above. Similarly, in some embodiments, computing device 105 determines 215 a plurality of demand points within demand locality 410 and determines a cost corresponding to each combination of the source points and the demand points.

Computing device 105 determines 250 one or more source points, demand points, and/or connection paths based on the corresponding costs and/or the required capacity. In one embodiment, computing device 105 selects the lowest-cost set of connection paths that is capable of providing the required capacity to demand point 405.

In some embodiments, computing device 105 prompts a user to select one or more source points, demand points, and/or connection paths. Referring to FIG. 5, graphical interface 500 displays information associated with first source locality 432, second source locality 436, and third source locality 440 (shown in FIG. 4). For each source locality, graphical interface 500 includes a distance 505 (e.g., an absolute distance between a corresponding source point and a demand point or a length of a corresponding connection path), a capacity 510, a cost 515, and a selector 520.

In some embodiments, computing device 105 determines 235 a plurality of connection paths between a source point and demand point 405. In an exemplary embodiment, graphical interface 500 displays only a lowest-cost connection path for each source locality.

A required capacity field 525 indicates the capacity required at demand point 405 (shown in FIG. 4). As source localities are selected or de-selected via selectors 520, graphical interface 500 updates a total capacity field 530 to reflect an aggregate capacity of the selected source localities. Graphical interface 500 also updates a total cost field 535 to reflect the aggregate cost of connecting the selected source localities to demand point 405. In the exemplary embodiment, first source locality 432 and third source locality 440 are selected by a user to provide demand point 405 with a total capacity that is greater than the required capacity.

In some embodiments, computing device 105 automatically selects the lowest-cost set of connection paths that is capable of providing the required capacity to demand point 405. In such an embodiment, graphical interface 500 may emphasize the connection paths in the selected set. In the exemplary embodiment, graphical interface 500 includes a recommended connection path icon 540 adjacent to the information associated with third source locality 440.

In the exemplary embodiment, graphical interface 500 includes an OK button 545. Referring to FIGS. 2 and 5, when a user selects OK button 545, computing device 105 generates 255 a utility network schematic and/or a bill of materials indicating a set of equipment required to convey the utility from the source point(s) to the demand point(s) along the selected connection paths. For example, the bill of materials may include the equipment determined 240 to be required for each selected connection path.

Figure 6:
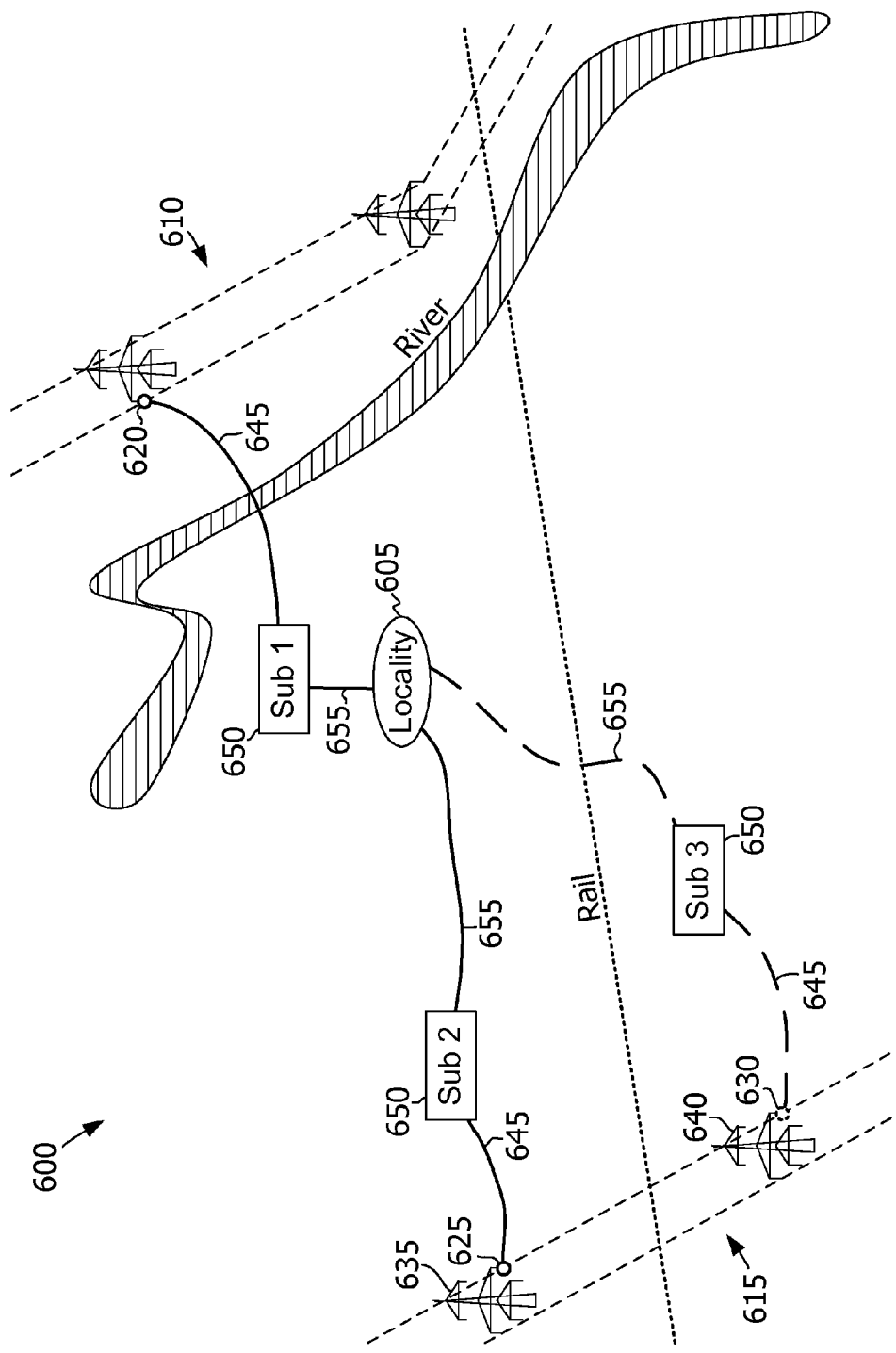
FIG. 6 is an exemplary map for providing a utility to a locality from one or more transmission lines.

Some embodiments facilitate determining 230 a source point along an existing or planned utility transmission line. FIG. 6 is an exemplary map 600 for providing a utility to a locality from one or more transmission lines. Map 600 includes a demand locality 605 to which electricity is to be provided. More specifically, the utility may be provided to one or more demand points (not shown) within demand locality 605, as described above. Within the geographic area shown in map 600 are a first transmission line 610 and a second transmission line 615.

Referring to FIGS. 2 and 6, computing device 105 determines 230 a first source point 620 along first transmission line 610 and a second source point 625 and a third source point 630 along second transmission line 615. In one embodiment, first source point 620, second source point 625, and third source point 630 are determined 230 by receiving a selection of each point from a user. In another embodiment, computing device 105 receives a selection of first transmission line 610 and second transmission line 615 from the user and determines 230 one or more source point along each. For example, computing device 105 may determine 230 that a first suspension tower 635 and a second suspension tower 640 associated with second transmission line 615 may be used as second source point 625 and third source point 630, respectively.

Computing device 105 may also determine 245 a cost for connecting each source point 625 and 630 to demand locality 605, as described above. For example, computing device 105 may determine that connecting first transmission line 610 or second transmission line 615 to demand locality 605 from any source point requires a transmission line 645, a substation 650, and a distribution line 655. With regard to second transmission line 615, computing device 105 may calculate the cost of this equipment for both second source point 625 and third source point 630 and select second source point 625 over third source point 630 based on determining that second source point 625 is associated with a cost that is lower than the cost associated with third source point 630. In addition to, or in the alternative, computing device 105 may prompt a user to select one or more connection paths associated with first source point 620, second source point 625, and/or third source point 630, as described above with reference to graphical interface 500.

Embodiments described herein facilitate automating the design of a utility network by programmatically determining a plurality of connection paths between one or more source points and one or more demand points, and by calculating a total cost associated with each connection path, such that a most cost-effective method of conveying the utility to the demand point(s) may be selected. Moreover, such embodiments facilitate automatically determining details such as the required capacity at a demand point and the equipment required for connecting the demand point to a source point, enabling a further reduction in the cost and delay associated with utility network design. As a result of such automation, the embodiments provided may decrease the level of user experience required to create an effective and cost-efficient utility network design.

The methods and systems described herein are not limited to the specific embodiments described herein. For example, components of each system and/or steps of each method may be used and/or practiced independently and separately from other components and/or steps described herein. In addition, each component and/or step may also be used and/or practiced with other apparatus and methods.

While the invention has been described in terms of various specific embodiments, those skilled in the art will recognize that the invention may be practiced with modification within the spirit and scope of the claims.

What is claimed is:

1. A system for use in designing a utility network, said system comprising:
   an input interface configured to receive an indication of a geographic area within which the utility network is to be constructed; and
   a processor coupled to said input interface and programmed to:
      identify one or more obstructions within the geographic area;
      determine a demand point for the utility network, wherein the demand point has a required capacity of a utility;
      determine a plurality of source points to provide the utility associated with the utility network to the demand point to satisfy the required capacity; and
      determine one or more connection paths within the geographic area to convey the utility from each of the plurality of source points to the demand point based at least in part on the identified obstructions and the required capacity.

2. A system according to claim 1, wherein said processor is programmed to determine a plurality of source points at least in part by:
   identifying a plurality of source points that are proximate to the demand point and that have a capacity to provide the utility at a rate required by the first demand point;
   calculating a cost of connecting each source point of the identified source points to the demand point; and
   selecting two or more source points of the identified source points based on the calculated costs.

3. A system according to claim 2, wherein said processor is programmed to calculate a cost of connecting each source point to the demand point based at least in part on at least one of a regulatory constraint, a demand constraint, a capacity constraint, a zoning constraint, and an environmental constraint.

4. A system according to claim 1, wherein said processor is programmed to determine the demand point at least in part by:
   receiving a selection of a locality within the geographic area, wherein the locality contains one or more properties requiring the utility; and
   selecting a point from a plurality of available points within the locality based on a cost of connecting the selected point to the properties and the plurality of source points.

5. A system according to claim 1, wherein said processor is further programmed to generate a bill of materials indicating a set of equipment required to convey the utility from the plurality of source points to the demand point along the determined connection paths.

6. A system according to claim 5, wherein said processor is further programmed to generate a schematic for conveying the utility from the plurality of source points to the demand point along the determined connection paths using the set of equipment indicated by the bill of materials.

7. A system according to claim 5, wherein said processor is programmed to generate the bill of materials at least in part by determining a set of transmission lines required to convey the utility from the plurality of source points to the demand point along the determined connection paths.

8. A method for use in designing a utility network to provide a utility to a geographic area, said method comprising:
   determining, by a computer system, a demand point within the geographic area at which to provide the utility, wherein the demand point has a required capacity;
   determining, by a computer system, a plurality of source points to provide the utility to the demand point to satisfy the required capacity of the demand point;
   determining, by the computer system, a plurality of connection paths through the geographic area connecting each of the plurality of source points to the demand point, based at least in part on the required capacity, wherein each connection path has a pairing including one of the plurality of source points and the demand point; and
   generating, by the computer system, a bill of materials for each pairing of one of the source points and the demand point indicating a set of equipment required to convey the utility from each source point to the demand point along the determined connection path.

9. A method according to claim 8, wherein determining the plurality of connection paths through the geographic area comprises determining at least one connection path that circumvents one or more obstructions within the geographic area.

10. A method according to claim 8, wherein determining a plurality of source points comprises:
    receiving a selection of a locality;
    identifying a plurality of potential source points within the selected locality; and
    selecting a first source point of the plurality of potential source points based at least in part on a cost of connecting the first source point to the demand point.

11. A method according to claim 8, wherein determining a plurality of source points comprises:
    receiving a selection of a transmission line; and
    determining a plurality of potential source points along the selected transmission line based at least in part on a cost of connecting a first source point of the plurality of potential source points to the demand point.

12. A method according to claim 8, wherein determining a connection path of the plurality of connection paths through the geographic area connecting the source points to the demand point of said pairing-comprises:
   calculating a cost for each connection path of a plurality of connection paths connecting the source points to the demand point; and
   selecting a first connection path from the plurality of connection paths based at least in part on the calculated costs.

13. A method according to claim 8, wherein determining a demand point comprises:
   identifying a plurality of potential demand points within the geographic area; and
   selecting a first demand point from the plurality of potential demand points based at least in part on a cost of connecting a first source point of the plurality of source points to the first demand point.

14. One or more non-transitory computer-readable storage media having computer-executable instructions embodied thereon, wherein when executed by at least one processor, the computer-executable instructions cause the at least one processor to:
   determine a demand point within a geographic area at which to provide the utility, wherein the demand point has a required capacity;
   determine a plurality of source points to provide the utility to the demand point to satisfy the required capacity of the demand point; and
   determine one or more connection paths through the geographic area for conveying the utility from each of the plurality of source points to the demand point, wherein at least one of the connection paths is determined based at least in part on one or more obstructions within the geographic area and the required capacity.

15. One or more computer-readable storage media according to claim 14, wherein when executed by the at least one processor, the computer-executable instructions further cause the at least one processor to determine a set of equipment for conveying the utility along the at least one determined connection path.

16. One or more computer-readable storage media according to claim 14, wherein when executed by the at least one processor, the computer-executable instructions cause the at least one processor to determine at least one of the plurality of source points at least in part by:
   receiving a selection of a locality;
   identifying a plurality of potential source points within the selected locality; and
   selecting a first source point of the plurality of potential source points based at least in part on a cost of connecting the first source point to the demand point.

17. One or more computer-readable storage media according to claim 14, wherein when executed by the at least one processor, the computer-executable instructions cause the at least one processor to determine a demand point at least in part by:
   receiving a selection of a locality;
   identifying a plurality of potential demand points within the selected locality; and
   selecting a first demand point of the plurality of potential demand points based at least in part on a cost of connecting a first source point of the plurality of source points to the first demand point.

18. One or more computer-readable storage media according to claim 14, wherein when executed by the at least one processor, the computer-executable instructions further cause the at least one processor to determine a connection path at least in part by:
   calculating a cost for each connection path of a plurality of connection paths connecting one of the source points to the demand point; and
   selecting a first connection path from the plurality of connection paths based at least in part on the first connection path having a lowest cost among the calculated costs.

19. One or more computer-readable storage media according to claim 18, wherein when executed by the at least one processor, the computer-executable instructions further cause the at least one processor to:
   receive a selection of a utility type and a selection of a required capacity; and
   determine a source point at least in part by identifying one or more source points proximate to the geographic area that are capable of providing the selected utility type at the required capacity.

20. One or more computer-readable storage media according to claim 18, wherein when executed by the at least one processor, the computer-executable instructions further cause the at least one processor to generate a bill of materials indicating a set of equipment required to convey the utility from the source points to the demand point along said first connection path.

* * * * *